United States Patent [19]

Hsu

[11] Patent Number: 5,554,544
[45] Date of Patent: Sep. 10, 1996

[54] FIELD EDGE MANUFACTURE OF A T-GATE LDD POCKET DEVICE

[75] Inventor: Chen-Chung Hsu, Taichung, Taiwan

[73] Assignee: United Microelectronics Corporation, Hsin-Chu, Taiwan

[21] Appl. No.: 512,834

[22] Filed: Aug. 9, 1995

[51] Int. Cl.$^6$ .................................................. H01L 21/265
[52] U.S. Cl. ............................ 437/35; 437/40; 437/41; 437/44; 437/69; 257/344; 257/345
[58] Field of Search ............................. 437/35, 40 GS, 437/41 GS, 44, 69; 257/344, 345

[56] References Cited

U.S. PATENT DOCUMENTS

| | | | |
|---|---|---|---|
| 3,730,778 | 5/1973 | Shannon et al. | 437/35 |
| 5,108,937 | 4/1992 | Tsai et al. | 437/40 |
| 5,223,445 | 6/1993 | Fuse | 437/35 |
| 5,344,787 | 9/1994 | Nagalingam et al. | 437/35 |
| 5,401,994 | 3/1995 | Adan | 257/335 |
| 5,405,787 | 4/1995 | Kurimoto | 437/35 |
| 5,439,835 | 8/1995 | Gonzalez | 437/35 |
| 5,498,556 | 3/1996 | Hong et al. | 437/35 |

FOREIGN PATENT DOCUMENTS

| | | | |
|---|---|---|---|
| 3262130 | 11/1991 | Japan | 437/35 |

Primary Examiner—Tom Thomas
Assistant Examiner—Lynne A. Gurley
Attorney, Agent, or Firm—William H. Wright

[57] ABSTRACT

A method of manufacturing a T-gate LDD pocket device is shown. Field oxide regions are formed in and on the surface of a semiconductor substrate. The T-gate device will be formed between the field oxide regions. A gate oxide layer is formed on the surface of the substrate between the field oxide. A layer of polysilicon is deposited over the gate oxide layer. Portions of the polysilicon layer are etched away leaving the polysilicon layer only between and over the inner edges of the field oxide. The remaining polysilicon is covered with a photoresist mask wherein the inner edges of the field oxide underlying the polysilicon are protected by the mask. The field oxide not covered by the mask are etched away to form the T-gate. A first set of ions of a first conductivity are implanted at a tilt angle to form lightly doped regions from regions where the field oxide have been removed and underlying the inner edges of the remaining field oxide. A second set of ions of the first conductivity are implanted to form first heavily doped regions at the surface of the substrate from which the field oxide have been removed. Spacers are formed on the sidewalls of the T-gate to protect the lightly doped regions from degradation. A third set of ions of a second conductivity type opposite to the first conductivity type are implanted to form pocket heavily doped regions underlying the first heavily doped regions to complete the fabrication.

15 Claims, 4 Drawing Sheets

FIELD EDGE MANUFACTURE OF A T-GATE LDD POCKET DEVICE

BACKGROUND OF THE INVENTION

1. Field of the Invention

The present invention relates to the fabrication of integrated circuit devices, and more particularly, to a method of making a T-gate LDD pocket device in the fabrication of integrated circuits.

2. Description of the Prior Art

FIG. 1 illustrates a typical lightly doped drain (LDD) device of the prior art. Gate electrode 16 has been formed over gate silicon oxide layer 14 on the surface of semiconductor substrate 10. Lightly doped regions 20, heavily doped source and drain regions 22, and P+ regions 24 have been ion implanted into the semiconductor substrate at the gate edges.

There are a number of problems with this type of device structure. One problem is that the gate edge is stressed by high electrical field-induced leakage. Also, the thin gate oxide at the gate edge over the source/drain region induces a large capacitance during device operation. This thin gate oxide is easily damaged by electro-static discharge (ESD) at the N-region, and the high heat at the junction edge melts or otherwise adversely affects thin gate silicon oxide and polysilicon. The P+ pocket implantation after the N-implantation degrades the doping concentration of the N– region and reduces channel resistance, saturation current, and device operation speed. An improved LDD pocket device without the aforementioned problems is desired.

When the prior art MOS FET devices are used for ESD protection circuit purposes, these devices are easily damaged at the N– region gate oxide. The prior art gate over the source/drain region is too large. The N– implant will diffuse sideways by process heating, so the gate easily overlaps the N– region. The ESD will cause damage and device failure at the drain edge where the gate silicon oxide will break down due to the high heat developed by the ESD effects.

U.S. Pat. No. 5,108,937 to Tsai et al shows the formation of FOX structures and the removal of some of the FOX structures followed by formation of MOS FET devices. Large tilt angle implantation methods are generally known in the art.

SUMMARY OF THE INVENTION

Accordingly, it is a primary object of the invention to provide a process for fabricating an improved LDD pocket integrated circuit device.

It is another object of the present invention to provide a process for fabricating an integrated circuit device with a reduced gate edge electrical field.

It is further object of the invention to provide a process for fabricating an integrated circuit device which reduces the size of the gate over the source/drain capacitor.

Yet another object is to provide a process for fabricating an integrated circuit device with improved gate to drain leakage characteristics.

Yet another object is to provide a process for fabricating an integrated circuit device which protects the N– region from degradation.

A still further object of the invention is to provide a process for fabricating an integrated circuit device with improved device operation speed, channel resistance, and saturation current.

Yet another object of the invention is to provide a T-gate LDD pocket device with reduced gate edge electrical field, improved gate to drain leakage characteristics, and improved device operation speed, channel resistance, and saturation current.

In accordance with the objects of the invention, a new method of field edge manufacturing of a T-gate LDD pocket device integrated circuit is described. Field oxide regions are formed in and on the surface of a semiconductor substrate. The T-gate device will be formed between the field oxide regions. A gate oxide layer is formed on the surface of the semiconductor substrate between the field oxide regions. A layer of polysilicon is deposited over the surface of the gate oxide layer. Portions of the polysilicon layer are etched away leaving the polysilicon layer only between and over the inner edges of the field oxide regions. The remaining polysilicon layer is covered with a photoresist mask wherein the inner edges of the field oxide regions underlying the polysilicon layer are protected by the photoresist mask. The field oxide regions not covered by said photoresist mask are etched away to form the T-gate device. A first set of ions having a first conductivity type are implanted at a tilt angle to form lightly doped regions at the surface of the semiconductor substrate from which the field oxide regions have been removed and underlying the inner edges of the remaining field oxide regions. A second set of ions of the first conductivity type are implanted to form first heavily doped regions at the surface of the semiconductor substrate from which the field oxide regions have been removed. Spacers are formed on the sidewalls of the T-gate device wherein the spacers protect the lightly doped regions from degradation. A third set of ions of a second conductivity type wherein the second conductivity type is opposite to the first conductivity type are implanted to form pocket heavily doped regions underlying the first heavily doped regions to complete the fabrication of the T-gate LDD pocket device in the manufacture of an integrated circuit.

According to the objects of the present invention, a new T-gate LDD pocket device integrated circuit is described. The device comprises a layer of gate silicon oxide on the surface of a semiconductor substrate. A field oxide tip is on either end of the gate silicon oxide layer wherein each field oxide tip has a concave shape with respect to the gate silicon oxide layer. A polysilicon gate overlies the gate silicon oxide layer and the field oxide tips wherein the edges of the gate overlying the field oxide tips are upturned. Silicon oxide spacers are formed on the sidewalls of the gate and the field oxide tips. Lightly doped regions of a first conductivity type lie within the semiconductor substrate underlying the field oxide tips. Heavily doped regions of the first conductivity type lie within the semiconductor substrate on either side of the region underlying the polysilicon gate. Pocket regions of a second conductivity type underlie the heavily doped regions wherein the second conductivity type is opposite to the first conductivity type.

BRIEF DESCRIPTION OF THE DRAWINGS

In the accompanying drawings forming a material part of this description, there is shown.

DESCRIPTION OF THE PREFERRED EMBODIMENTS

FIGS. 2 through 7 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

Figure 1:
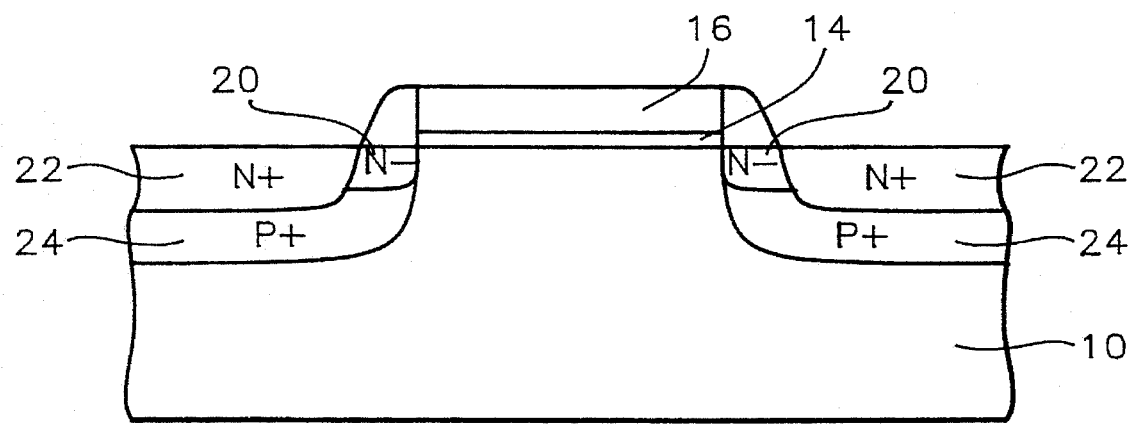
FIG. 1 is a cross-sectional representation of an integrated circuit of the prior art.
Figure 2:
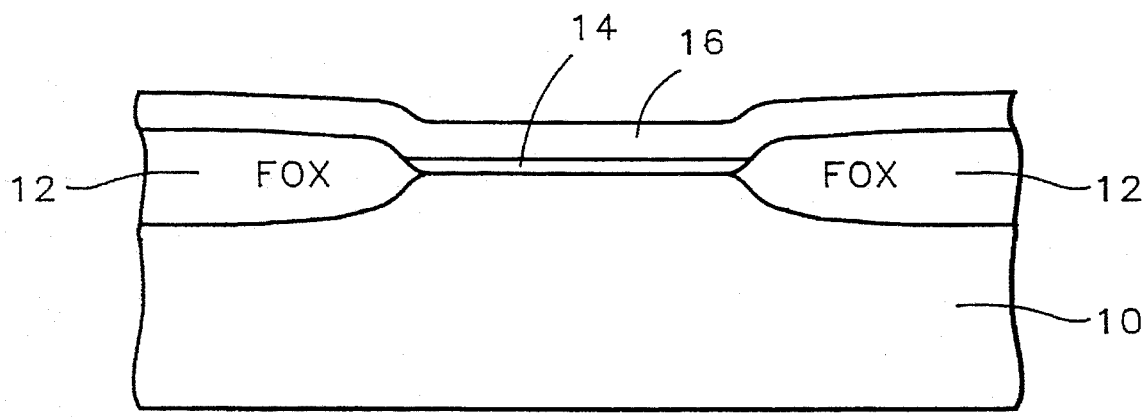
FIGS. 2 through 7 are cross-sectional representations of a preferred embodiment of the present invention.

Referring now more particularly to FIG. 2, there is shown a semiconductor substrate 10, preferably composed of silicon having a (100) crystallographic orientation. Field oxide regions 12 are formed as is conventional in the art. The T-gate device of the present invention is to be formed between the field oxide regions. A layer of gate silicon oxide 14 is deposited or thermally grown on the surface of the semiconductor substrate between the field oxide regions to a thickness of between about 80 to 250 Angstroms. A layer of polysilicon 16 is deposited by chemical vapor deposition to a thickness of between about 1500 to 4000 Angstroms and is doped in situ or ion implanted after deposition as is conventional in the art.

Figure 3:
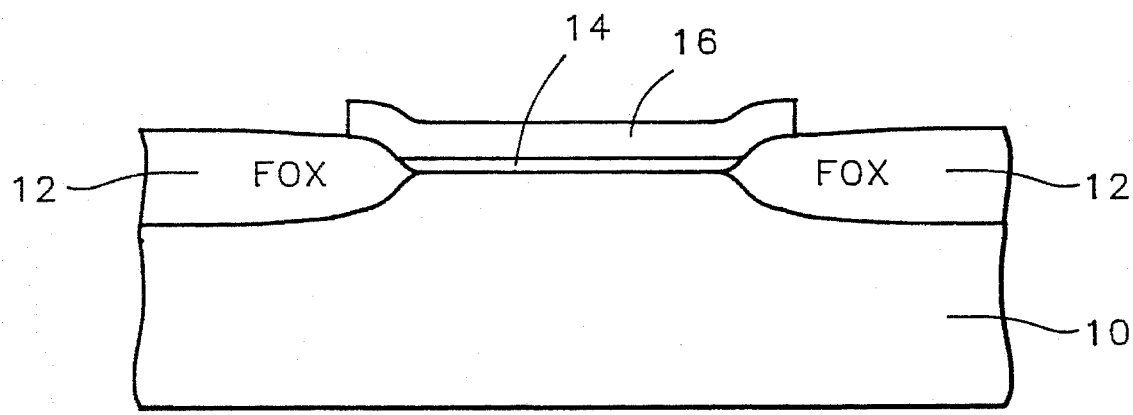
Figure 4:
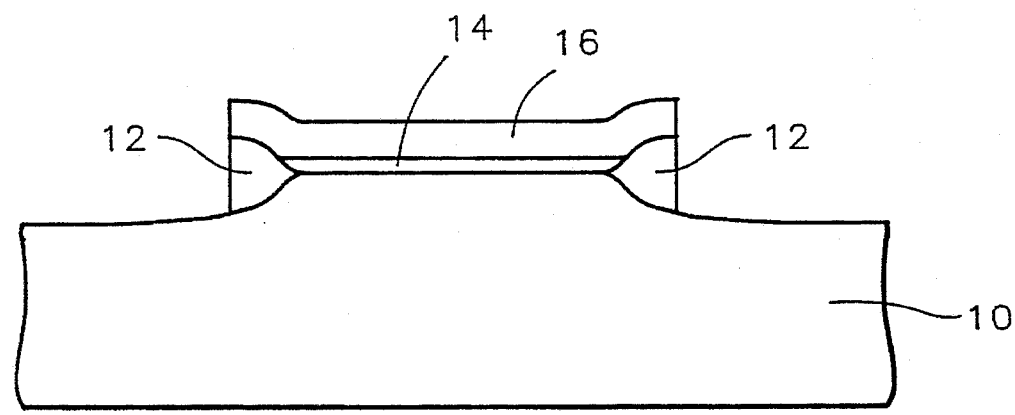

Referring now to FIG. 3, the polysilicon layer 16 is etched to form the polysilicon gate overlying the gate silicon oxide layer and the two bird's beak inner edges of the field oxide regions. The polysilicon gate is covered with a photoresist mask. The bird's beak edges of the field oxide regions underlying the polysilicon gate are protected by the photoresist mask. The field oxide regions not covered by the photoresist mask are etched away, as shown in FIG. 4, leaving field oxide tips underlying the edges of the polysilicon gate. The T-gate device has now been formed.

Figure 5:
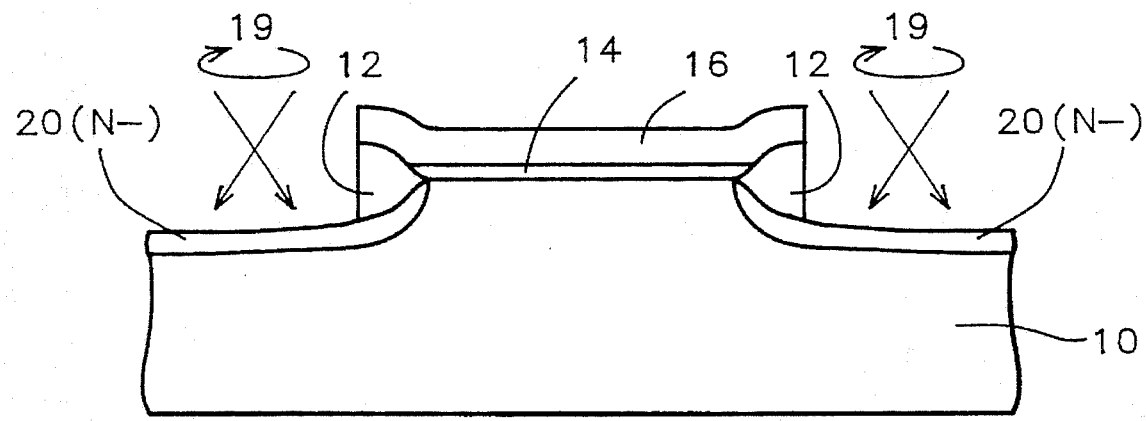

Referring now to FIG. 5, lightly doped regions 20 are formed by implanting ions 19 into the semiconductor substrate at a tilt angle of between about 30° to 45° and rotating the substrate for uniformity. The lightly doped regions extend under the field oxide tips 12. For an N-implantation, phosphorus ions are implanted at a dosage of between about 1 E 13 to 1 E 14 atoms/cm$^2$ and energy of between about 30 to 80 KeV. For P-implantation, not shown, $BF_2$ ions are implanted at a dosage of between about 1 E 13 to 1 E 14 atoms/cm$^2$ and energy of between about 30 to 80 KeV.

Figure 6:
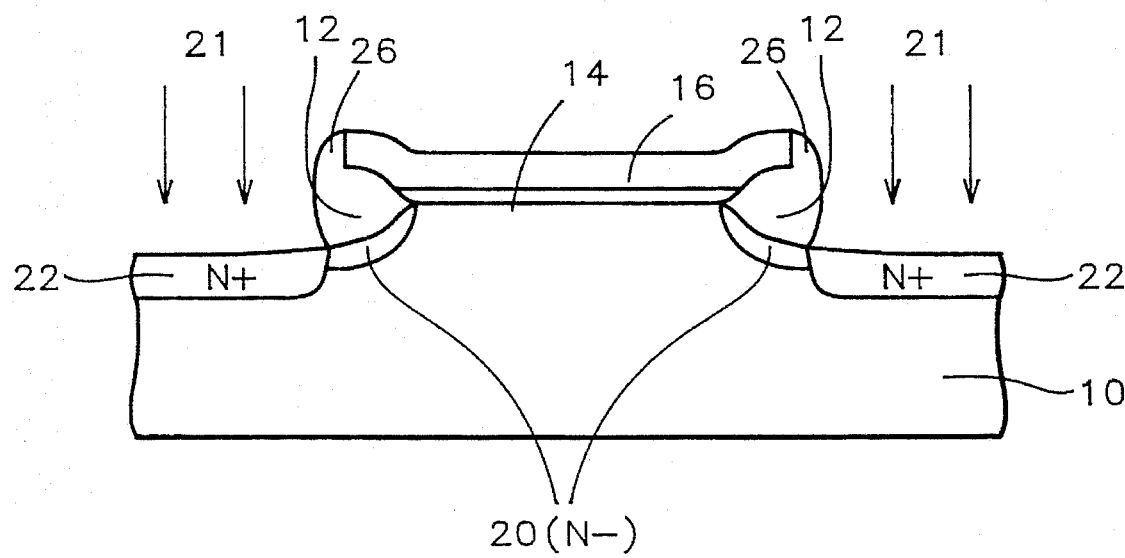

Referring now to FIG. 6, ions 21 are implanted at no tilt angle; that is, a tilt angle of between about 0° to 7°; to form heavily doped regions 22. For an N+ implantation, arsenic ions are implanted at a dosage of between about 1 E 15 to 1 E 16 atoms/cm$^2$ and energy of between about 50 to 100 KeV. For a PMOS integrated circuit device, not shown, $BF_2$ ions are implanted with a dosage of between about 1 E 15 to 1 E 16 atoms/cm$^2$ and energy of between about 30 to 80 KeV.

Next, a layer of silicon oxide is deposited over the surface of the semiconductor substrate and etched away to leave spacers 26 on the sidewalls of the T-gate.

Figure 7:
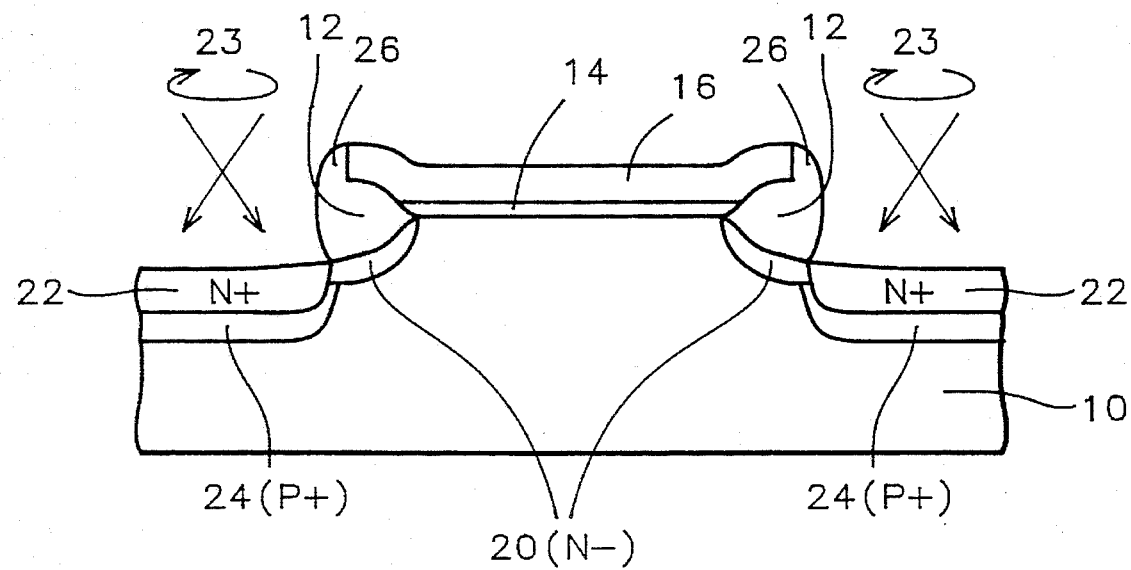

Referring now to FIG. 7, the pocket implant will now be performed. The pocket region 24 is formed by implanting ions 23 at a tilt angle of between about 30° to 45° and rotating the substrate to provide for uniform coverage. The pocket regions are formed underlying the heavily doped regions, but not underlying the lightly doped regions because of the presence of the spacers 26. The thick field edge gate oxide and spacer will prevent the pocket regions 24 from degrading the lightly doped regions 20. For a P+ implantation, boron ions are implanted at a dosage of between about 2 E 13 to 4 E 13 atoms/cm$^2$ and energy of between about 60 to 80 KeV. For a PMOS integrated circuit device, not shown, phosphorus $P_{31}$ ions are implanted with a dosage of between about 1 E 13 to 1 E 14 atoms/cm$^2$ and energy of between about 50 to 80 KeV. This completes formation of the T-gate LDD pocket device. Further processing continues as is conventional in the art to provide electrical connections between device elements of the integrated circuit.

The device formed by the method of the present invention has a reduced gate edge electrical field. The gate length over the source and drain capacitors 22 is reduced. Therefore, the source and drain capacitances are reduced as seen from relationship $C = e_o A/d$ where A is area and d is distance. The thick gate edge gate oxide composed of the field oxide tips and spacers improves gate to drain leakage characteristics or ESD damage at the drain N– region. The surface step difference between the heavily doped 22 and lightly doped 20 regions and the thick gate oxide edge blocks the degradation of the lightly doped region 20 by the pocket region 24.

P+ pocket can keep the N– region that didn't attack by the P+ implant. The P+ implant is for punchthrough stop. Submicron N+ regions can easily be punched through by applied voltage, so the P+ implant is added to the channel to prevent this punch through shorting. In prior art LDD devices, the N– concentration is degraded by the P+ pocket implant. In the present process, the edge thick gate silicon oxide will block and reduce the N– degradation. These improvements result in a device with improved device operation speed, channel resistance, and saturation current.

Figure 8:
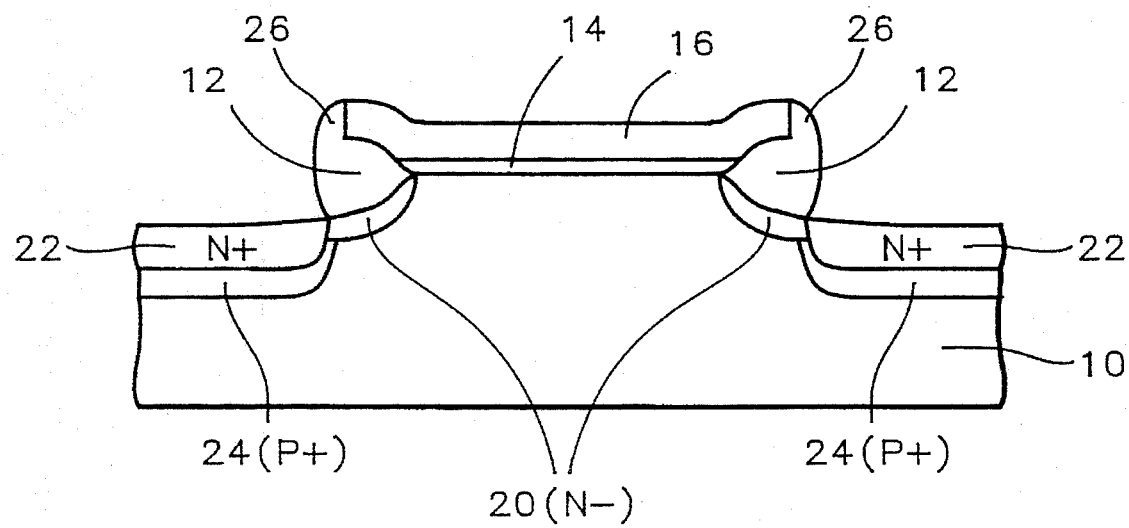
FIG. 8 is a cross-sectional representation of a completed device of the present invention.

The T-gate LDD pocket device integrated circuit of the present invention illustrated in FIG. 8 comprises a gate silicon oxide layer 14 on the surface of a semiconductor substrate 10. A field oxide tip 12 is on either end of the gate silicon oxide layer wherein each field oxide tip has a concave shape with respect to the gate silicon oxide layer. A polysilicon gate 16 overlies the gate silicon oxide layer and the field oxide tips wherein the edges of the gate overlying the field oxide tips are upturned. Silicon oxide spacers 26 are formed on the sidewalls of the gate and the field oxide tips. Lightly doped regions 20 of a first conductivity type lie within the semiconductor substrate underlying the field oxide tips 12. The dopant concentration of the lightly doped regions is between about 1 E 13 to 1 E 14 atoms/cm$^3$ for N– regions and between about 1 E 13 to 1 E 14 atoms/cm$^3$ for P– regions. Heavily doped regions 22 of the first conductivity type lie within the semiconductor substrate on either side of the region underlying the polysilicon gate. The dopant concentration of the heavily doped regions is between about 1 E 15 to 1 E 16 atoms/cm$^3$ for N+ regions and between about 1 E 15 to 1 E 16 atoms/cm$^3$ for P+ regions. Pocket regions 24 of a second conductivity type underlie the heavily doped regions 22 wherein the second conductivity type is opposite to the first conductivity type. The dopant concentration of the pocket regions is between about 2 E 13 to 4 E 13 atoms/cm$^3$ for P+ regions and between about 1 E 13 to 1 E 14 atoms/cm$^3$ for N+ regions.

While the invention has been particularly shown and described with reference to the preferred embodiments thereof, it will be understood by those skilled in the art that various changes in form and details may be made without departing from the spirit and scope of the invention.

What is claimed is:

1. The method of manufacturing a T-gate LDD pocket device integrated circuit comprising:

providing field oxide regions in and on the surface of a semiconductor substrate wherein said T-gate device will be formed between said field oxide regions;

providing a gate oxide layer on the surface of said semiconductor substrate between said field oxide regions;

depositing a layer of polysilicon over the surface of said gate oxide layer;

etching away portions of said polysilicon layer leaving said polysilicon layer only between and over the inner edges of said field oxide regions;

covering said remaining polysilicon layer with a photoresist mask wherein the inner edges of said field oxide regions underlying said polysilicon layer are protected by said photoresist mask;

etching away said field oxide regions not covered by said photoresist mask to form said T-gate device;

implanting first ions having a first conductivity type at a tilt angle to form lightly doped regions at the surface of said semiconductor substrate from which said field oxide regions have been removed and underlying the inner edges of said remaining field oxide regions;

implanting second ions of said first conductivity type to form first heavily doped regions at the surface of said semiconductor substrate from which said field oxide regions have been removed;

forming spacers on the sidewalls of said T-gate device wherein said spacers protect said lightly doped regions from degradation; and implanting third ions of a second conductivity type wherein said second conductivity type is opposite to said first conductivity type to form pocket heavily doped regions underlying said first heavily doped regions to complete the fabrication of said T-gate LDD pocket device in the manufacture of said integrated circuit.

2. The method of claim 1 wherein said T-gate LDD pocket device is an NMOS device and wherein said first conductivity type is N and said second conductivity type is P.

3. The method of claim 1 wherein said T-gate LDD pocket device is a PMOS device and wherein said first conductivity type is P and said second conductivity type is N.

4. The method of claim 1 wherein said polysilicon layer is deposited to a thickness of between about 1500 to 4000 Angstroms.

5. The method of claim 1 wherein said first ions are phosphorus ions implanted at a dosage of between about 1 E 13 to 1 E 14 atoms/cm$^2$ and an energy of between about 50 to 80 KeV at a tilt angle of between about 30° to 45°.

6. The method of claim 1 wherein said second ions are arsenic ions implanted at a dosage of between about 1 E 15 to 1 E 16 atoms/cm$^2$ and an energy of between about 50 to 100 KeV.

7. The method of claim 1 wherein said third ions are boron ions implanted at a dosage of between about 2 E 13 to 4 E 13 atoms/cm$^2$ and an energy of between about 60 to 80 KeV at a tilt angle of between about 30° to 45°.

8. The method of manufacturing a T-gate LDD pocket device integrated circuit comprising:

providing field oxide regions in and on the surface of a semiconductor substrate wherein said T-gate device will be formed between said field oxide regions;

providing a gate oxide layer on the surface of said semiconductor substrate between said field oxide regions;

depositing a layer of polysilicon over the surface of said gate oxide layer;

etching away portions of said polysilicon layer leaving said polysilicon layer only between and over the inner edges of said field oxide regions;

covering said remaining polysilicon layer with a photoresist mask wherein the inner edges of said field oxide regions underlying said polysilicon layer are protected by said photoresist mask;

etching away said field oxide regions not covered by said photoresist mask to form said T-gate device;

implanting first ions having a first conductivity type at a tilt angle to form lightly doped regions at the surface of said semiconductor substrate from which said field oxide regions have been removed and underlying the inner edges of said remaining field oxide regions;

implanting second ions of said first conductivity type at no tilt angle to form first heavily doped regions at the surface of said semiconductor substrate from which said field oxide regions have been removed;

forming spacers on the sidewalls of said T-gate device; and implanting third ions of a second conductivity type at a tilt angle wherein said second conductivity type is opposite to said first conductivity type to form pocket heavily doped regions underlying said first heavily doped regions to complete the fabrication of said T-gate LDD pocket device in the manufacture of said integrated circuit.

9. The method of claim 8 wherein said T-gate LDD pocket device is an NMOS device and wherein said first conductivity type is N and said second conductivity type is P.

10. The method of claim 8 wherein said T-gate LDD pocket device is a PMOS device and wherein said first conductivity type is P and said second conductivity type is N.

11. The method of claim 8 wherein said polysilicon layer is deposited to a thickness of between about 1500 to 4000 Angstroms.

12. The method of claim 8 wherein said first ions are phosphorus ions implanted at a dosage of between about 1 E 13 to 1 E 14 atoms/cm$^2$ and an energy of between about 50 to 80 KeV at a tilt angle of between about 30° to 45°.

13. The method of claim 8 wherein said second ions are arsenic ions implanted at a dosage of between about 1 E 15 to 1 E 16 atoms/cm$^2$ and an energy of between about 50 to 100 KeV.

14. The method of claim 8 wherein said spacers are composed of silicon oxide and wherein said spacers protect said lightly doped regions from degradation.

15. The method of claim 8 wherein said third ions are boron ions implanted at a dosage of between about 2 E 13 to 4 E 13 atoms/cm$^2$ and an energy of between about 60 to 80 KeV at a tilt angle of between about 30° to 45°.

\* \* \* \* \*